United States Patent
Ito et al.

(10) Patent No.: US 6,369,562 B2
(45) Date of Patent: *Apr. 9, 2002

(54) ELECTRO-OPTICAL PROBE FOR OSCILLOSCOPE MEASURING SIGNAL WAVEFORM

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd., Tokyo (JP); Nippon Telegraph and Telephone Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,525

(22) Filed: Nov. 23, 1999

(30) Foreign Application Priority Data

Nov. 24, 1998 (JP) .............................. 10-333309
Sep. 28, 1999 (JP) ............................ 11-275385

(51) Int. Cl.$^7$ .............................................. G01R 31/00
(52) U.S. Cl. ................. 324/96; 324/750; 356/369; 355/67
(58) Field of Search .................. 324/750, 753, 324/96, 97; 356/369; 355/67, 68, 69

(56) References Cited

U.S. PATENT DOCUMENTS

| | | | |
|---|---|---|---|
| 3,675,125 A | * | 7/1972 | Jaecklin .............. 324/96 |
| 4,618,819 A | * | 10/1986 | Mourou et al. ........ 324/76.36 |
| 4,745,361 A | * | 5/1988 | Nees et al. ........... 324/753 |
| 4,864,123 A | * | 9/1989 | Mizutani et al. ....... 250/225 |
| 5,034,683 A | * | 7/1991 | Takahashi et al. ..... 324/753 |
| 5,157,324 A | | 10/1992 | Chollet ............... 324/96 |
| 5,459,394 A | * | 10/1995 | De Kort et al. ........ 324/96 |
| 5,999,005 A | * | 12/1999 | Fujii et al. ............. 324/750 |

FOREIGN PATENT DOCUMENTS

| | | | |
|---|---|---|---|
| EP | 0293840 | 12/1988 | ........ G01R/15/07 |
| EP | 0294836 | 12/1988 | ........ G01R/15/07 |
| EP | 645635 | 3/1995 | |
| WO | WO89/09413 | 10/1989 | |

* cited by examiner

Primary Examiner—Safet Metjahic
Assistant Examiner—Vincent Q. Nguyen
(74) Attorney, Agent, or Firm—Blakely, Sokoloff, Taylor & Zafman

(57) ABSTRACT

An electro-optical probe used for an oscilloscope (e.g., electro-optic sampling oscilloscope) is mainly constructed by a probe head and a probe unit. The probe head contains a metal pin and an electro-optical element having a reflector at its terminal surface. The probe unit contains a reduced number of optical parts, which are arranged such that an optical axis of incoming beams of the electro-optical element differs from a optical axis of outgoing beams of the electro-optical element. That is, laser beams output form a laser diode are subjected to convergence by a converging lens to produce converged beams, which are incident on the electro-optical element as its incoming beams. The incoming beams are subjected to reflection by the reflector to produce reflected beams, which are output from the electro-optical element as its outgoing beams. Then, the reflected beams are converted to parallel beams by a collimator lens, or they are converged by a converging lens. A polarization detector performs separation on input beams from the lens to produce separated components of beams, optical axes of which differ from each other. Those components of beams are respectively supplied to photodiodes, wherein they are converted to electric signals. Thus, it is possible to measure a waveform of a measured signal based on differences between the electric signals, which reflect changes of polarization states of the beams in the electro-optical element.

6 Claims, 3 Drawing Sheets

ELECTRO-OPTICAL PROBE FOR OSCILLOSCOPE MEASURING SIGNAL WAVEFORM

BACKGROUND OF THE INVENTION

1. Field of the Invention

This invention relates to electro-optical probes used for oscilloscopes that use electro-optical crystals to measure waveforms of signals based on electro-optical effects, and particularly to electro-optical probes used for electro-optic sampling oscilloscopes.

This application is based on Patent Application No. Hei 10-333309 filed in Japan, the content of which is incorporated herein by reference.

2. Description of the Related Art

In general, the electro-optic sampling oscilloscopes operate as follows:

Electric fields being caused to occur due to measured signals are connected with electro-optical crystals, on which laser beams are incident. Using polarization states of the laser beams in the electro-optical crystals, it is possible to detect the measured signals. Herein, the laser beams are formed in a pulse-like form, so that it is possible to measure waveforms of the signals with a very high resolution with respect to time. The electrooptic sampling oscilloscopes use electro-optical probes, which work based on the known electro-optical phenomenon.

As compared with the conventional sampling oscilloscopes using probes of an electric type, the electro-optic sampling oscilloscopes (abbreviated by "EOS" oscilloscopes) draw considerable attention of scientists and engineers because of some advantages, as follows:

(1) It is easy to perform measurement on the waveforms of the signals because the EOS oscilloscopes do not require ground lines when measuring the signals.

(2) A metal pin provided at a tip end of the electro-optical probe is insulated from the circuitry, so it is possible to realize high input impedance. Therefore, it is possible to perform measurement without substantially disturbing states of measuring points.

(3) The EOS oscilloscope uses optical pulses for the measurement. So, it is possible to perform the measurement in a broad band, a frequency range of which is increased up to Giga-Hertz (GHz) order.

Now, a description will be given with respect to an example of the EOS oscilloscope with reference to FIG. 3. Specifically, FIG. 3 shows a probe unit 15 of the EOS oscilloscope, which is equipped with a probe head 1 made of an insulator. A metal pin 1a is installed at a center of the probe head 1. An electro-optical element (i.e., electro-optical crystal) 2 is equipped with a reflector (or reflection mirror) 2a, which is formed at a terminal surface facing with an end of the metal pin 1a and is brought into contact with the metal pin 1a. The probe unit 15 contains collimator lenses 3, 10, half-wavelength (or ½ wavelength) plates 4, 7, a quarter-wavelength (or ¼ wavelength) plate 5, polarizing beam splitters 6, 9, and a Faraday rotator 8, which rotates a polarizing plane of incident light by 45 degrees. In addition, the probe unit 15 contains a laser diode 11, which radiates laser beams in response to a control signal output from a main body of the EOS oscilloscope (not shown), as well as photodiodes 12, 13, which convert incoming laser beams to electric signals. Those electric signals are output to the main body of the EOS oscilloscope. Incidentally, the probe unit 15 contains an optical isolator 14a, which is configured by the half-wavelength plates 4, 7, quarter-wavelength plate 5, beam splatters 6, 9 and Faraday rotator 8.

Next, an optical path of the laser beams radiated from the laser diode 11 will be described with reference to FIG. 3, wherein it is denoted by a reference symbol "C".

The collimator lens 10 converts the laser beams output from the laser diode 11 to parallel beams, which propagate straight through the polarizing beam splitter 9, Faraday rotator 8, half-wavelength plate 7 and polarizing beam splitter 6 sequentially in a forward direction. They also pass through the quarter-wavelength plate 5 and half-wavelength plate 4 sequentially. Thereafter, the parallel beams are converged together by the collimator lens 3 and are then incident on the electro-optical element 2 as its incoming beams. The incoming beams of the electro-optical element 2 are reflected by the reflector 2a, which is formed at the terminal surface of the electro-optical element 2 facing with the metal pin 1a.

Then, reflected beams are converted to parallel beams by the collimator lens 3. The parallel beams propagate through the half-wavelength plate 4 and quarter-wavelength plate 5 in a backward direction. A part of the parallel beams is reflected by the polarizing beam splitter 6 and is incident on the photodiode 12. In contrast, the parallel beams that transmit through the polarizing beam splitter 6 are reflected by the polarizing beam splitter 9 and are incident on the photodiode 13.

The quarter-wavelength plate 4 is provided to make adjustment such that strength of incoming laser beams of the photodiode 12 coincides with strength of incoming laser beams of the photodiode 13. In addition, the half-wavelength plate 4 is provided to adjust a polarizing plane of an incoming beam of the electro-optical element 2.

Next, a description will be given with respect to a series of measuring operations to perform measurement on signals by using the aforementioned probe of the EOS oscilloscope shown in FIG. 3.

When a human operator brings the metal pin 1a in contact with a measuring point (not shown), an electric voltage is applied to the metal pin 1a to form an electric field. Such an electric field spreads and is connected with the electro-optical element 2. Due to Pockel's effect, there is caused to occur a phenomenon in which a birefringence index changes. The laser diode 11 radiates laser beams, which are incident on the electro-optical element 2. Due to the aforementioned phenomenon, the incoming laser beams that propagate in the electro-optical element 2 change in polarization states. Then, the laser beams whose polarization states are changed are reflected by the reflector 2a and are incident on the photodiodes 12, 13 respectively. The photodiodes 12, 13 convert the incoming beams thereof to electric signals.

Accompanied with changes of the voltage applied to the metal pin 1a at the measuring point, changes occur with respect to the polarization states of the beams in the electro-optical element 2. Those changes bring differences between outputs of the photodiodes 12, 13. By detecting such output differences, it is possible to measure an electric signal being applied to the metal pin 1a.

Incidentally, the electric signals produced by the photodiodes 12, 13 of the EOS probe are input to the EOS oscilloscope, in which they are processed. Instead of using the EOS oscilloscope, it is possible to use some conventional measurement devices such as the real-time oscilloscope. Herein, the measurement device is connected to the photodiodes 12, 13 by way of a dedicated controller so as to perform measurement on signals. That is, the EOS probe can be widely used for the measurement devices to enable broad-band measurement on the signals with ease.

The aforementioned EOS oscilloscope is designed to separate the incoming beams of the electro-optical element 2, which are brought by the optical isolator 14a, from the reflected beams which are reflected by the reflector 2a. Such a design causes a problem in which a number of optical parts constructing the optical isolator 14a is increased.

Due to an increased number of optical parts, "unnecessary" reflected beams are produced by some optical parts. This causes another problem in which an amount of noise component is increased while a S/N ratio in signal processing is reduced. In addition, there is a still another problem in which the incoming beams of the two photodiodes 12, 13 need to be adjusted in intensities by rotation of the optical parts.

SUMMARY OF THE INVENTION

It is an object of the invention to provide an electro-optical probe used for an electro-optic sampling oscilloscope, which is equipped with a reduced number of optical parts and which is improved in S/N ratio.

Basically, an electro-optical probe of this invention is provided for an electro-optic sampling oscilloscope, which is designed as follows:

Electric fields caused by measured signals are connected with an electro-optical crystal, on which optical pulses produced based on timing signals are incident and in which the optical pulses are changed in polarization states. Thus, the electro-optic sampling oscilloscope is capable of measuring waveforms of the measured signals based on changes of the polarization states.

Particularly, this invention provides an improvement in an optical system of the electro-optical probe.

Namely, the electro-optical probe is mainly constructed by a probe head and a probe unit. The probe head contains a metal pin being brought into contact with a measuring point to detect an electric field caused by the measured signal and an electro-optical element having a reflector at its terminal surface facing with an end of the metal pin. The probe unit contains a reduced number of optical parts, which are arranged such that an optical axis of incoming beams of the electro-optical element differs from a optical axis of outgoing beams of the electro-optical element. That is, laser beams radiated from a laser diode propagate along a first optical path and are subjected to convergence by a converging lens to produce converged beams, which are incident on the electro-optical element as its incoming beams. The incoming beams are subjected to reflection by the reflector to produce reflected beams, which are output from the electro-optical element as its outgoing beams along a second optical path. Herein, the first and second optical paths are selected not to be in parallel with each other.

In the electro-optical element, the beams are changed in polarization states in response to the electric field. Then, the reflected beams output from the electro-optical element are converted to parallel beams by a collimator lens and are then input to a polarization detector. Or, they are converged by a converging lens and are then input to the polarization detector. The polarization detector performs separation on the input beams thereof to produce separated components of beams, optical axes of which differ from each other. Herein, a first component of beams substantially corresponding to the input beams is incident on a first photodiode, while a second component of beams corresponding to a part of the input beams is incident on a second photodiode. Thus, the first and second photodiodes respectively output electric signals.

Changes of the polarization states of the beams in the electro-optical element are reflected by differences between the electric signals output from the photodiodes. Thus, it is possible to measure the waveform of the measured signal based on the differences between the electric signals.

Because of the aforementioned arrangement of the optical parts in the probe unit and because of adoption of the polarization detector whose configuration is simple as compared with the conventional optical isolator, it is possible to reduce a total number of the optical parts, while it is possible to improve a S/N ratio in signal processing with respect to measurement of the waveforms of the signals.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

This invention will be described in detail by way of examples in conjunction with the accompanying drawings.

Figure 1:
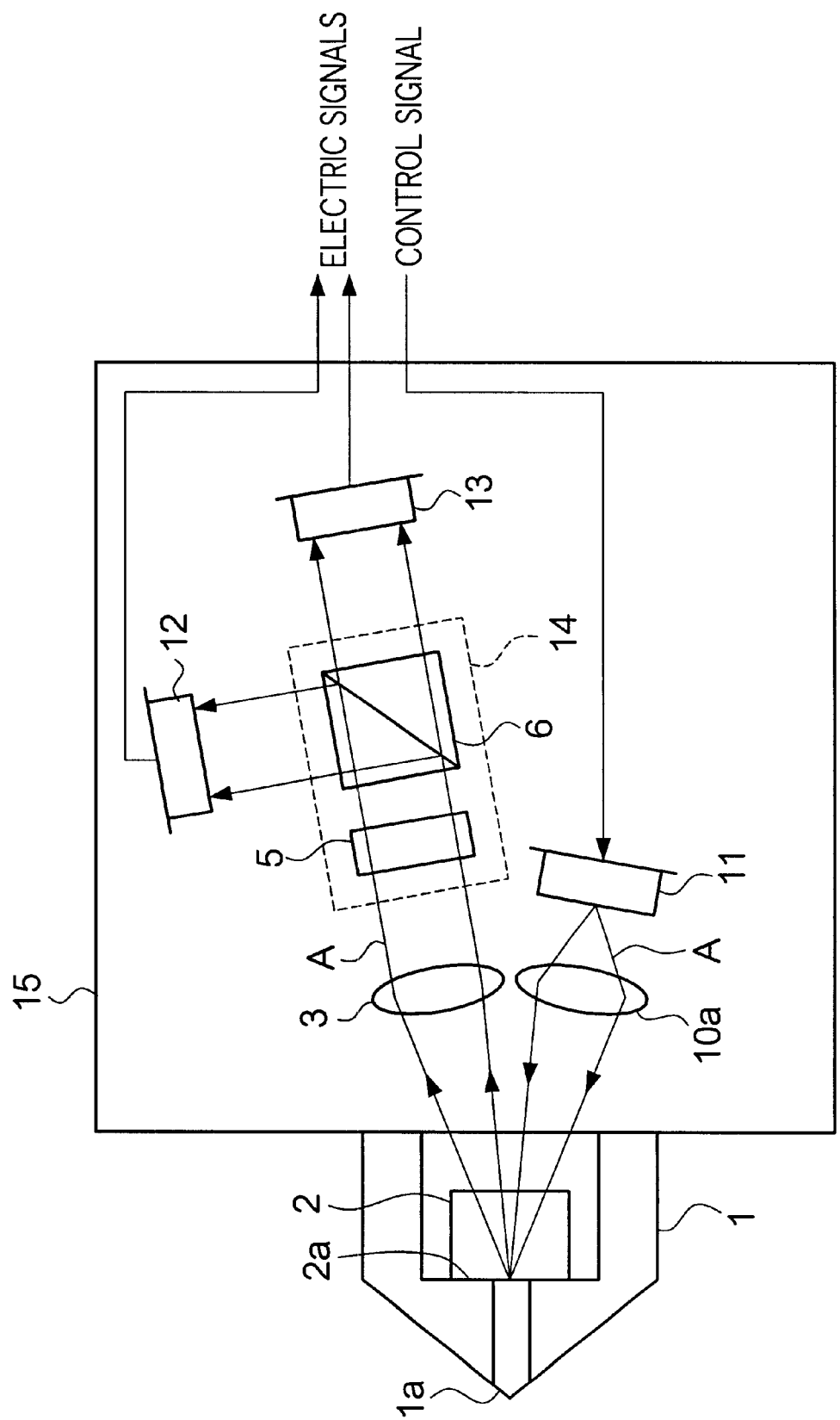
FIG. 1 is a schematic illustration partially in section showing a construction of an electro-optical probe used for an electro-optic sampling oscilloscope in accordance with embodiment 1 of the invention.

FIG. 1 shows a configuration of an electro-optical probe of an electro-optic sampling oscilloscope in accordance with embodiment 1 of the invention. Specifically, FIG. 1 shows internal configurations of a probe head 1 and a probe unit 15, wherein parts equivalent to those shown in FIG. 3 are designated by the same reference numerals, hence, the description thereof will be omitted according to needs.

Figure 3:
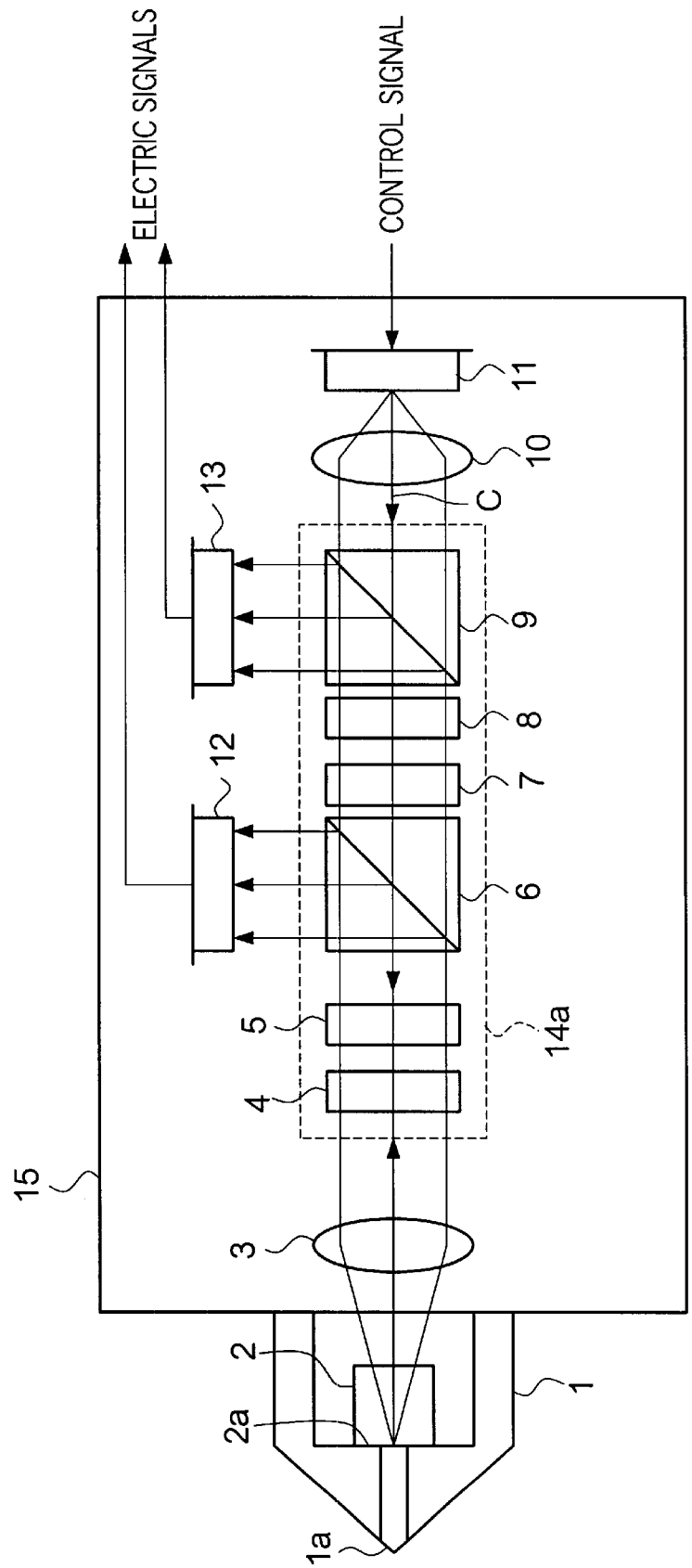
FIG. 3 is a schematic illustration partially in section showing a construction of an electro-optical probe used for the conventional electro-optic sampling oscilloscope.

Different from the foregoing probe unit 15 of FIG. 3 which uses the optical isolator 14a, the probe unit 15 shown in FIG. 1 is configured using a polarization detector 14, which is provided for separation of polarization components. Herein, the polarization detector 14 is configured by the aforementioned quarter-wavelength plate 5 and polarizing beam splitter 6 without using the aforementioned half-wavelength plates 4, 7, Faraday rotator 8 and polarizing beam splitter 9, all of which are excluded from the probe unit 15 shown in FIG. 1. In addition, the present embodiment is characterized by that an optical axis of incoming beams of the electro-optical element 2 differs from an optical axis of outgoing beams of the electro-optical element 2. Further, the collimator lens 10 shown in FIG. 3 is replaced with a converging lens 10a.

Next, optical paths of laser beams radiated from the laser diode 11 will be described with reference to FIG. 1, wherein each optical path is denoted by a reference symbol "A".

First, laser beams output from the laser diode 11 are converged together by the converging lens 10a and are incident on the electro-optical element 2 as its incoming beams. Then, the incoming beams is reflected by the reflector 2a, which is formed at the terminal surface of the electro-optical element 2 facing with the metal pin 1a.

The converging lens 10a is arranged at a location, which matches with a point on the reflector 2a at which the laser beams radiated from the laser diode 11 are to be converged. So, the laser beams are converged (focused) at such a point on the reflector 2a.

Reflected laser beams reflected by the reflector 2a are converted to parallel beams by the collimator lens 3. The parallel beams enter the polarization detector 14, wherein they pass through the quarter-wavelength plate 5 and are then subjected to separation by the polarizing beam splitter 6. That is, reflected beams being reflected by the polarizing beam splitter 6 are incident on the photodiode 12, while transmitting beams that transmit through the polarizing beam splitter 6 are output from the polarization detector 14 and are then incident on the photodiode 13. Therefore, the photodiode 12 converts the reflected beams to electric signals, while the photodiode 13 converts the transmitting beams to electric signals.

Accompanied with voltage changes at a measuring point, changes are caused to occur in polarization states of the incoming laser beams in the electro-optical element 2. Such changes bring differences between outputs of the photodiodes 12, 13. By detecting such output differences between the photodiodes 12, 13, it is possible to measure electric signals being applied to the metal pin 1a of the probe head 1.

In the present embodiment, the optical parts are designed and arranged such that the optical axis of the incoming beams of the electro-optical element 2 differs from the optical axis of the outgoing beams of the electro-optical element 2 which correspond to the reflected beams of the reflector 2a. Such design and arrangement do not require the optical isolator 14a. As compared with the aforementioned optical isolator 14a that requires a relatively large number of optical parts, the polarization detector 14 that is provided for separation of the polarization components is configured by a small number of optical parts. So, it is possible to reduce a total number of optical parts required for construction of the probe unit 15.

Because the present embodiment is capable of reducing a number of optical parts, it is possible to suppress an amount of noise components, which emerge due to reflection at surfaces of the optical parts. In addition, it is possible to reduce a number of points for adjustments of optical axes among the optical parts in the probe unit 15.

The present embodiment uses a "single" polarizing beam splitter (6) for separation of the beams, so that the separated beams are respectively distributed to and are directly received by the two photodiodes 12, 13. So, it is possible to eliminate a difference in balance between intensities of incoming beams of the photodiodes 12, 13, regardless of an optical loss.

Figure 2:
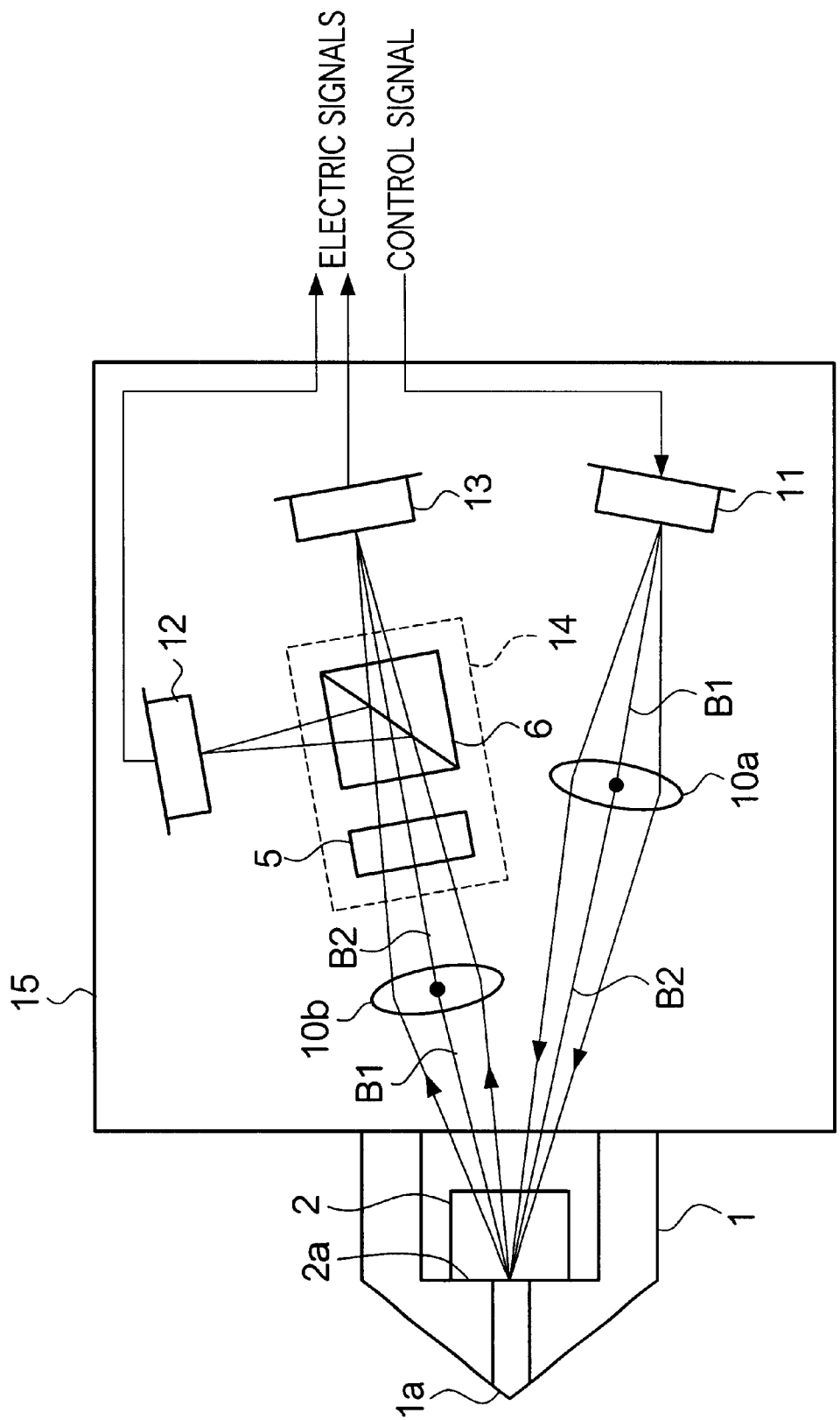
FIG. 2 is a schematic illustration partially in section showing a construction of an electro-optical probe used for the electro-optic sampling oscilloscope in accordance with embodiment 2 of the invention.

Next, a description will be given with respect to an electro-optical probe of an electro-optic sampling oscilloscope in accordance with embodiment 2 of the invention with reference to FIG. 2. In FIG. 2, parts equivalent to those shown in FIG. 1 are designated by the same reference numerals, hence, the description thereof will be omitted according to needs.

The probe unit 15 of FIG. 2 differs from the aforementioned probe unit of FIG. 1 in that the collimator lens 3 is replaced with a converging lens 10b. Herein, the converging lens 10b is identical to the converging lens 10a in focal length. The converging lens 10a is arranged distant from the laser diode 11 by an optical-axis length B1, while the converging lens 10a is also arranged distant from the reflector 2a of the electro-optical element 2 by an optical-axis length B2. In addition, the converging lens 10b is arranged distant from the reflector 2a by the optical-axis length B1, while the converging lens 10b is also arranged distant from the photodiode 13 by the optical-axis length B2.

The aforementioned arrangement sets same focal lengths with respect to both of the lenses 10a, 10b. In addition, it is possible to perform convergence effectively on the beams input to the photodiodes 12, 13 respectively. Therefore, it is possible to efficiently introduce the beams, originally radiated from the laser diode 11, to light-receiving elements of the photodiodes 12, 13 respectively. Thus, it is possible to improve a S/N ratio in signal processing of the electro-optic sampling oscilloscope.

Incidentally, it is possible to modify the aforementioned embodiments such that the laser diode 11 radiates continuous light. In that case, it is possible to perform signal processing by using the general-purpose measurement devices such as the real-time oscilloscope, sampling oscilloscope and spectrum analyzer instead of the EOS oscilloscope. Herein, the photodiodes 12, 13 are connected to the measurement device by way of a dedicated controller or else.

As described heretofore, this invention has a variety of technical features and effects, which are summarized as follows:

(1) The optical parts are arranged in the probe unit such that the optical axis of the incoming beams of the electro-optical element differs from the optical axis of the outgoing beams of the electro-optical element. So, it is unnecessary to provide the probe unit with the optical isolator, which is replaced with the polarization detector.

(2) Because the polarization detector requires a small number of optical parts as compared with the optical isolator, it is possible to reduce a total number of optical parts constructing the electro-optical probe.

(3) Due to reduction of the number of the optical parts of the electro-optical probe, it is possible to suppress an amount of noise components, which emerge due to reflection of surfaces of the optical parts.

(4) Only a single polarizing beam splitter is required for separation of beams, which are to be distributed to two photodiodes respectively.

So, it is possible to set a same optical length with respect to both of the beams input to the photodiodes. Thus, it is possible to eliminate a difference in balance between intensities of the incoming beams of the two photodiodes.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A method of measuring a waveform of a measured signal using an electro-optical probe comprising:

radiating laser beams from a laser diode;

converging the laser beams with a converging lens incident to an electro-optical element whereby the converged laser beams are changed in polarization states under the effect of an electric field;

reflecting the converged laser beams to a collimator lens on an optical axis different than the optical axis of the converging laser beams using a reflector in the electro-optical element;

collimating the reflected laser beams to produce parallel laser beams;

separating the parallel laser beams with a quarter-wavelength plate and a polarizing beam splitter to produce polarization components of beams, propagating directions of which differ; and converting the polarization components of beams to produce electric signals.

2. An electro-optical probe used for an oscilloscope comprising:

a laser diode for radiating laser beams based on a control signal given from a main body of the oscilloscope;

an electro-optical element equipped with a reflector at a terminal surface, wherein the electro-optical element changes in optical characteristics under an effect of an electric field, which propagates thereto by way of a metal pin brought in contact with the terminal surface;

a converging lens for converging the laser beams to produce converged beams, which are input to the electro-optical element;

a collimator lens for converting reflected beams, corresponding to the laser beams reflected by the reflector, to parallel beams;

a polarization detector, configured by a quarter-wavelength plate and a polarizing beam splitter, for separating the parallel beams to produce polarization components of beams, which are propagated in a predetermined direction, such that the polarization components are at a right angle with respect to each other; and a photodiode for converting the parallel beams separated by the polarization detector to electric signals, wherein an optical axis of incoming beams of the electro-optical element corresponding to the converged beams differs from an optical axis of outgoing beams of the electro-optic element corresponding to the reflected beams reflected by the reflector.

3. An electro-optical probe according to claim 1 wherein the photodiode and the laser diode are connected to the main body of the oscilloscope, and wherein the laser diode radiates the laser beams in a pulse-like form based on the control signal given from the main body of the oscilloscope.

4. An electro-optical probe according to claim 2 wherein the laser diode radiates the laser beams in a form of continuous light.

5. An electro-optical prove used for an oscilloscope that measures a waveform of a measured signal, said electro-optical probe comprising:

a probe head containing a metal pin and an electro-optical element, wherein the electro-optical element has a reflector at a terminal surface, which is brought into contact with an end of the metal pin, so that the electro-optical element changes in optical characteristics under an effect of an electric field which is caused by the measured signal and which is detected by the metal pin;

a laser diode for radiating laser beams in accordance with a control signal given from the oscilloscope;

a converging lens for converging the laser beams to produce converged beams, which are incident on the electro-optical element wherein the converged beams are reflected by the reflector to produce reflected beams and are changed in polarization states under the effect of the electric field;

a second lens for transmitting the reflected beams therethrough to produce transmitted beams;

a polarization detector for separating the transmitted beams to produce a first component of beams substantially corresponding to the transmitting beams and a second component of beams, an optical axis of which differs from an optical axis of the first component of beams;

a first photodiode for converting the first component of beams to a first electric signal; and a second photodiode for converting the second component of beams to a second electric signal, wherein the oscilloscope measures the waveform of the measured signal based on the fist and second electric signals, and wherein the laser diode, the first lens, the second lens and the polarization detector are arranged such that an optical axis of incoming beams of the electro-optical element corresponding to the converged beams differs from an optical axis of outgoing beams of the electro-optical element corresponding to the reflected beams.

6. An electro-optical probe according to claim 5 wherein the second lens is a collimator lens for converting the reflected beams to parallel beams, which are input to the polarization detector as the transmitted beams.

* * * * *